United States Patent
Gupta

(10) Patent No.: US 6,681,354 B2
(45) Date of Patent: Jan. 20, 2004

(54) EMBEDDED FIELD PROGRAMMABLE GATE ARRAY FOR PERFORMING BUILT-IN SELF TEST FUNCTIONS IN A SYSTEM ON A CHIP AND METHOD OF OPERATION

(75) Inventor: Vidyabhusan Gupta, Palo Alto, CA (US)

(73) Assignee: STMicroelectronics, Inc., Carrollton, TX (US)

(*) Notice: Subject to any disclaimer, the term of this patent is extended or adjusted under 35 U.S.C. 154(b) by 528 days.

(21) Appl. No.: 09/773,104

(22) Filed: Jan. 31, 2001

(65) Prior Publication Data

US 2002/0104051 A1 Aug. 1, 2002

(51) Int. Cl.[7] .................. G01R 31/3177; G06F 1/25
(52) U.S. Cl. ............... 714/725; 714/30; 714/42; 714/733
(58) Field of Search ............. 714/30, 42, 725, 714/733

(56) References Cited

U.S. PATENT DOCUMENTS 6,003,150 A * 12/1999 Stroud et al. ............... 714/725
6,460,148 B2 * 10/2002 Veenstra et al. ............. 714/39
6,542,844 B1 * 4/2003 Hanna ......................... 714/725

OTHER PUBLICATIONS

Lu, Shyue–kung; Shih, Jen–Sheng; Wu, Cheng–Wen Built-in Self–Test and Fault Diagnosis for Lookup Table FPGA's, May 28–31, 2000, ISCAS 2000 IEEE International Symposium on Circuits and Systems, vol. 1, pp. 80–83.*

* cited by examiner

Primary Examiner—R. Stephen Dildine
(74) Attorney, Agent, or Firm—Lisa K. Jorgenson; William A. Munck

(57) ABSTRACT

There is disclosed a field programmable gate array for use in an integrated processing system capable of testing other embedded circuit components in the integrated processing system. The field programmable gate array detects a trigger signal (such as a power reset) in the integrated processing system. In response to the trigger signal, the field programmable gate array receives first test program instructions from a first external source and executes the first test program instructions in order to test the other embedded circuit components in the integrated processing system. When testing of the other embedded circuit components is complete, the field programmable gate array loads its normal operating code and performs its normal functions.

23 Claims, 2 Drawing Sheets

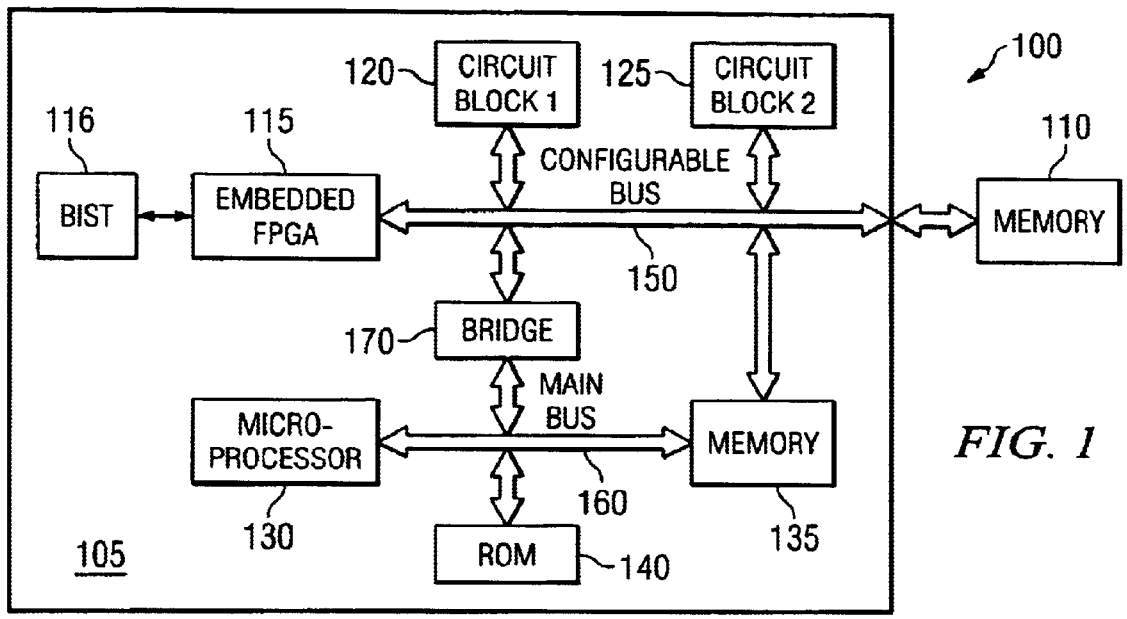
FIG. 1
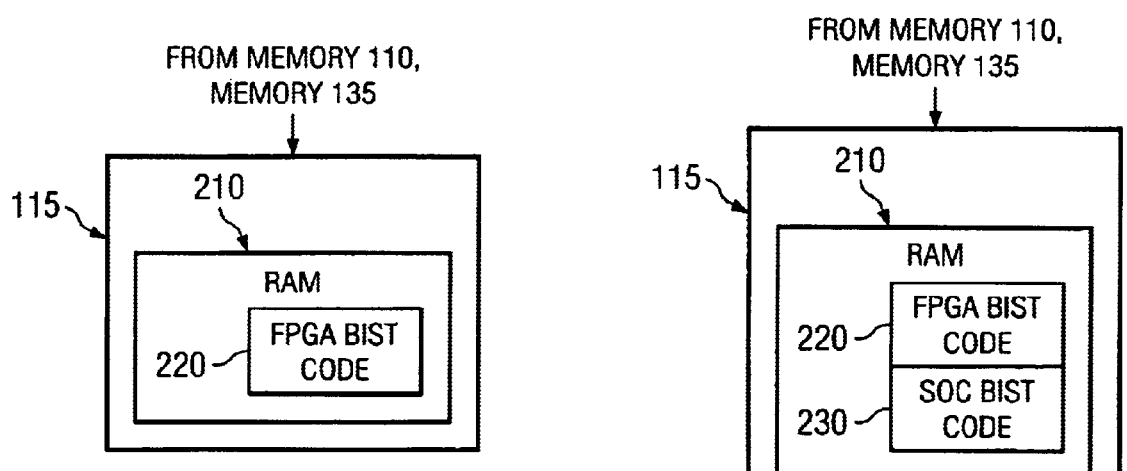
FIG. 2A
FIG. 2B

EMBEDDED FIELD PROGRAMMABLE GATE ARRAY FOR PERFORMING BUILT-IN SELF TEST FUNCTIONS IN A SYSTEM ON A CHIP AND METHOD OF OPERATION

TECHNICAL FIELD OF THE INVENTION

The present invention is generally directed to system-on-a-chip (SoC) devices and, in particular, to a SoC device that includes an embedded field programmable gate array (FPGA) circuit that performs built-in self test (BIST) functions.

BACKGROUND OF THE INVENTION

The speed, power, and complexity of integrated circuits, such as microprocessor chips, random access memory (RAM) chips, application specific integrated circuit (ASIC) chips, and the like, have increased dramatically in the last twenty years. More recently, these increases have led to development of so-called system-on-a-chip (SoC) devices. A SoC device allows nearly all of the components of a complex system, such as a cell phone or a television receiver, to be integrated onto a single piece of silicon. This level of integration greatly reduces the size and power consumption of the system, while generally also reducing manufacturing costs.

The complexity of state-of-the-art integrated circuits, particularly SoC devices, has increased the likelihood of a manufacturing defect occurring on the chip. To increase the reliability of integrated circuits and to detect error conditions and defective chips more rapidly, it is common practice to incorporate built-in self test (BIST) circuitry in SoC devices and other type of integrated circuits. BIST circuits are commonly used for memories, such as static random access memories (SRAM), dynamic random access memories (DRAM), flash RAM, and the like. State-of-the-art chip level BIST circuitry uses a dedicated hardware controller to execute the BIST testing and to report the pass or fail result to an external device. The BIST tests may be automatically generated for a given block of logic.

However, adding built-in self test circuitry to a system-on-a-chip device or other integrated circuit presents additional problems. Hardware-based BIST circuits occupy valuable space on the integrated circuit die. As the level of sophistication of self-testing increases, so does the size and complexity of the BIST circuitry. This results in a tradeoff between silicon area and detection sensitivity. Furthermore, the BIST circuitry itself may cause errors. This is particularly true as the complexity of the BIST circuit increases. Still another problem with BIST circuitry is that hardware BIST devices have a fixed test functionality that is determined at tapeout.

Therefore, there is a need in the art for system-on-a-chip (SoC) devices and other large scale integrated circuits that implement improved BIST functionality. In particular, there is a need for BIST circuitry that occupies a minimum amount of space on an integrated circuit chip. More particularly, there is a need for hardware-based BIST devices that are flexible enough to allow modification of BIST testing after the BIST circuit has been fabricated on an integrated circuit.

SUMMARY OF THE INVENTION

The present invention discloses a system-on-a-chip (SoC) device in which a pre-existing embedded file programmable gate array (FPGA) circuit in the SoC device performs the BIST function for the remainder of the SoC device. The embedded FPGA circuit normally performs some other function in the SoC device. However, upon boot-up or the occurrence of some other event, the embedded FPGA is configured to perform BIST testing. If the SoC device passes the BIST testing, the embedded FPGA is re-configured to perform the system function that the embedded FPGA normally performs.

The operation of an embedded FPGA according to the principles of the present invention may be as follows:

1) At power-up a specific BIST device or FPGA BIST code for the FPGA checks the FPGA integrity;
2) If the FPGA passes its own self-test, a bitstream configuration (i.e., program instructions) representing the SoC BIST code for the remainder of the SoC chip is loaded into the FPGA;
3) The SoC BIST code sets up the FPGA hardware to perform an exhaustive hardware test of the system; and
4) Once the SoC BIST function is completed, the embedded FPGA can be reprogrammed to be used as a block of embedded reconfigurable FPGA logic.

Because the FPGA is reconfigurable, the BIST procedures can evolve as certain failure modes or marginal operations are identified by repeated testing. Also, if certain tests prove to be redundant, then the BIST testing can be modified so that the run-time of the tests can be optimized. Using the FPGA for BIST testing and for the normal function of the FPGA allows more efficient usage of the silicon area by trading a small amount of time and area for efficiency and reusability.

To address the above-discussed deficiencies of the prior art, it is a primary object of the present invention to provide a field programmable gate array for use in an integrated processing system and capable of testing other embedded circuit components in the integrated processing system. According to an advantageous embodiment of the present invention, the field programmable gate array is capable of detecting a trigger signal (such as a power reset) in the integrated processing system. In response to the trigger signal, the field programmable gate array receives first test program instructions from a first external source and executes the first test program instructions in order to test the other embedded circuit components in the integrated processing system.

According to one embodiment of the present invention, the field programmable gate array comprises a memory capable of storing the first test program instructions.

According to another embodiment of the present invention, the field programmable gate array is capable of controlling a configurable data bus coupling the field programmable gate array to the other embedded circuit components in the integrated processing system.

According to still another embodiment of the present invention, the field programmable gate array retrieves the first test program instructions from a second memory via the configurable data bus.

According to yet another embodiment of the present invention, the second memory is one of the other embedded circuit components in the integrated processing system.

According to a further embodiment of the present invention, the second memory is external to the integrated processing system.

According to a still further embodiment of the present invention, the field programmable gate array is capable of determining if the other embedded circuit components passed tests performed by the first test program instructions and wherein the field programmable gate array, in response to a determination that the other embedded circuit components passed the tests, is capable of receiving application program instructions from a second external source and executing the application program instructions.

According to a yet further embodiment of the present invention, the field programmable gate array stores the first test program instructions in an internal memory and overwrites the first test program instructions with the application program instructions.

In one embodiment of the present invention, the field programmable gate array is capable of receiving self test program instructions from a third external source and executing the self test program instructions in order to test the operation of the field programmable gate array.

In another embodiment of the present invention, the field programmable gate array is coupled to a built-in self test (BIST) circuit capable of testing the operation of the field programmable gate array.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 1 illustrates a processing system, which includes an exemplary system-on-a-chip (SoC) device according to one embodiment of the present invention;

FIGS. 2A–2C illustrate the contents of a random access memory (RAM) in the exemplary embedded field programmable gate array (FPGA) at various points during the operation of the embedded FPGA according to one embodiment of the present invention.

DETAILED DESCRIPTION OF THE INVENTION

Figure 2C:
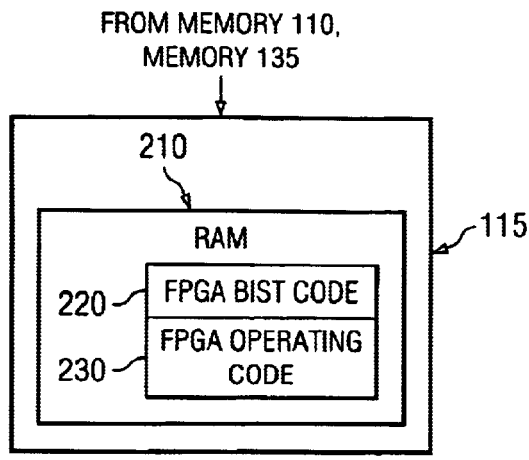
Figure 3:
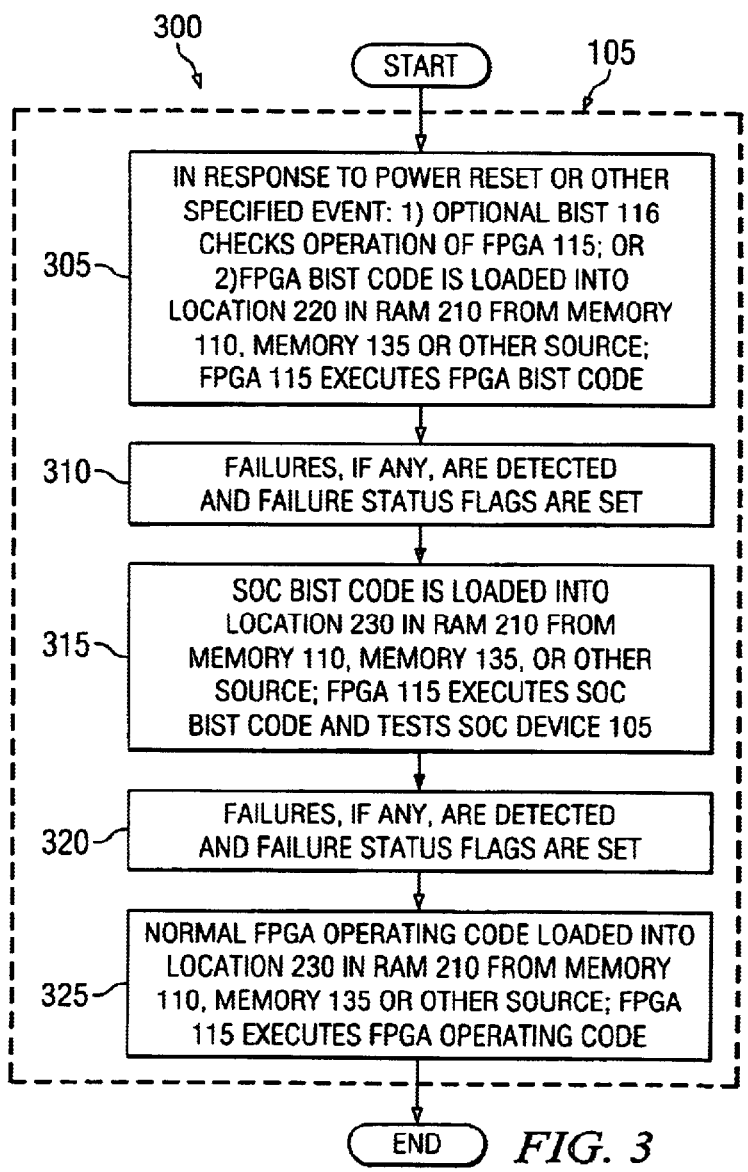
FIG. 3 illustrate the operation of the operation of the embedded FPGA according to one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged field programmable gate array (FPGA).

FIG. 1 illustrates processing system 100, which includes exemplary system-on-a-chip (SoC) device 105 according to one embodiment of the present invention. SoC device 105 is a single integrated circuit comprising embedded field programmable gate array (FPGA) 115, optional FPGA built-in self test (BIST) circuit 116, peripheral circuits 120 and 125, microprocessor 130, random access memory (RAM) 135, read-only memory (ROM) 140, configurable bus 150, main (or system) bus 160, and bridge circuit 170.

Processing system 100 is shown in a general level of detail because it is intended to represent any one of a wide variety of electronic devices, particularly consumer appliances. For example, processing system 100 may be a printer rendering system for use in a conventional laser printer. Processing system 100 also may represent selected portions of the video and audio compression-decompression circuitry of a video playback system, such as a video cassette recorder or a digital versatile disk (DVD) player. In another alternative embodiment, processing system 100 may comprise selected portions of a cable television set-top box or a stereo receiver.

Embedded FPGA 115 and peripheral circuits 120 and 125, which are arbitrarily labeled Circuit Block 1 and Circuit Block 2, respectively, may be configured to implement any designated function in processing system 100. For example, peripheral circuit 120 may be a video codec and peripheral circuit 125 may be an audio codec. In the ordinary operation of processing system 100, embedded FPGA 115 also may be a video codec, and audio codec, or some other functional unit, such as a bus controller for configurable bus 150.

In an exemplary embodiment of the present invention, microprocessor 130 executes an application program that may be stored in RAM 135. ROM 140 stores a start-up program that is executed by microprocessor 130 after a system reboot. Address and data information is transferred between microprocessor 130, RAM 135 and ROM 140 via main bus 160. Similarly, address and data information may be transferred between peripheral devices 120 and 125 and embedded FPGA 115 via configurable bus 150. Data traffic may be transferred between configurable bus 160 and main bus 160 via bridge 170, which provides isolation between configurable bus 150 and main bus 160 to increase overall system throughput.

In an exemplary embodiment of the present invention, processing system 100 also comprises an external memory 110, which may be, for example, a flash memory, a random access memory, a disc storage device, or the like. In accordance with the principles of the present invention, the SoC BIST program that is executed by embedded FPGA 115 may be stored in and retrieved from external memory 110 in the event of a reboot or other event that requires the execution of the SoC BIST program. In an alternate embodiment of the present invention, the SoC BIST program may also be stored in and retrieved from memory 135.

FIGS. 2A–2C illustrate the contents of random access memory 210 in embedded field programmable gate array (FPGA) 115 at various points during the operation of embedded FPGA 115 according to one embodiment of the present invention. FIG. 3 illustrates the overall operation of embedded FPGA 115 according to the exemplary embodiment. Upon resetting of system power or some other specified event (such as a failure detection), embedded FPGA 115 undergoes a BIST testing routine. According to one embodiment of the present invention, optional FPGA BIST circuit 116 checks the operation of embedded FPGA 115. According to an advantageous embodiment of the present invention, FPGA BIST circuit 116 may be omitted and embedded FPGA 115 may perform BIST tests on itself by executing special purpose FPGA BIST code that is loaded into location 220 in RAM 210 in embedded FPGA 115 from memory 110, memory 135, or some other source (process step 305). This is illustrated in FIG. 2A. The FPGA BIST code may be retrieved and loaded under the control of embedded FPGA 115 itself or under the control of some other device, such as microprocessor 130 executing a boot-up routine in ROM 140.

After embedded FPGA 115 is tested, either by executing FPGA BIST code in location 220 or by dedicated FPGA BIST circuit 116, status flags may be set in SOC device 105 to indicate that failures, if any, have been detected (process step 310). Assuming embedded FPGA 115 passes self test procedures, system-on-a-chip (SoC) BIST code is loaded into RAM 210 in embedded FPGA 115 from memory 110, memory 135, or some other source. This is illustrated in FIG. 2B. Embedded FPGA 115 then executes the SoC BIST code in order to test the other parts of SoC device 105 (process step 315). According to one embodiment of the present invention, the SoC BIST code may be loaded into location 230 in RAM 210, rather than overwriting the FPGA BIST code in location 220. According to another embodiment of the present invention, the SoC BIST code may be stored in location 220 in RAM 210, thereby overwriting the FPGA BIST code and reducing the memory requirements of embedded FPGA 115.

After embedded FPGA 115 has tested the other portions of SoC device 105, status flags may be set in SOC device 105 to indicate that failures, if any, have been detected (process step 320). Assuming SoC device 105 passes the BIST procedures executed by embedded FPGA 115, the normal FPGA operating code (e.g., application program) executed by embedded FPGA 115 is loaded into RAM 210 in embedded FPGA 115 from memory 110, memory 135, or some other source. This is illustrated in FIG. 2C. Embedded FPGA 115 then executes the FPGA operating code in order to perform the normal functions of embedded FPGA 115 (process step 325). According to one embodiment of the present invention, the FPGA operating code may be loaded into location 230 in RAM 210, rather than overwriting the FPGA BIST code in location 220. According to another embodiment of the present invention, the FPGA operating code may be stored in location 220 in RAM 210, thereby overwriting the FPGA BIST code and reducing the memory requirements of embedded FPGA 115. In still another embodiment of the present invention, the FPGA operating code may be loaded into a completely unused location in RAM 210, rather than overwriting the FPGA BIST code in location 220 or the SoC BIST code in location 230, thereby allowing all three blocks of code to exist in RAM 210 at the same time.

Although the present invention has been described in detail, those skilled in the art should understand that they can make various changes, substitutions and alterations herein without departing from the spirit and scope of the invention in its broadest form.

What is claimed is:

1. A field programmable gate array for use in an integrated processing system and capable of testing other embedded circuit components in said integrated processing system, wherein said field programmable gate array is capable of detecting a trigger signal in said integrated processing system and wherein said field programmable gate array, in response to said trigger signal, receives first test program instructions from a first external source and executes said first test program instructions in order to test said other embedded circuit components in said integrated processing system.

2. The field programmable gate array as set forth in claim 1 wherein said field programmable gate array comprises a memory capable of storing said first test program instructions.

3. The field programmable gate array as set forth in claim 2 wherein said field programmable gate array is capable of controlling a configurable data bus coupling said field programmable gate array to said other embedded circuit components in said integrated processing system.

4. The field programmable gate array as set forth in claim 3 wherein said field programmable gate array retrieves said first test program instructions from a second memory via said configurable data bus.

5. The field programmable gate array as set forth in claim 4 wherein said second memory is one of said other embedded circuit components in said integrated processing system.

6. The field programmable gate array as set forth in claim 4 wherein said second memory is external to said integrated processing system.

7. The field programmable gate array as set forth in claim 1 wherein said field programmable gate array is capable of determining if said other embedded circuit components passed tests performed by said first test program instructions and wherein said field programmable gate array, in response to a determination that said other embedded circuit components passed said tests, is capable of receiving application program instructions from a second external source and executing said application program instructions.

8. The field programmable gate array as set forth in claim 7 wherein said field programmable gate array stores said first test program instructions in an internal memory and overwrites said first test program instructions with said application program instructions.

9. The field programmable gate array as set forth in claim 7 wherein said field programmable gate array is capable of receiving self test program instructions from a third external source and executing said self test program instructions in order to test the operation of said field programmable gate array.

10. The field programmable gate array as set forth in claim 7 wherein said field programmable gate array is coupled to a built-in self test (BIST) circuit capable of testing the operation of said field programmable gate array.

11. A system-on-a-chip integrated circuit comprising:
   a main memory for storing main program instructions;
   a processing circuit capable of executing said main program instructions;

a plurality of embedded circuit components; and a field programmable gate array capable of testing said embedded circuit components in said system-on-a-chip integrated circuit, wherein said field programmable gate array is capable of detecting a trigger signal in said system-on-a-chip integrated circuit and wherein said field programmable gate array, in response to said trigger signal, receives first test program instructions from a first external source and executes said first test program instructions in order to test said embedded circuit components in said system-on-a-chip integrated circuit.

12. The system-on-a-chip integrated circuit as set forth in claim 11 wherein said field programmable gate array comprises a memory capable of storing said first test program instructions.

13. The system-on-a-chip integrated circuit as set forth in claim 12 wherein said field programmable gate array is capable of controlling a configurable data bus coupling said field programmable gate array to said plurality of embedded circuit components.

14. The system-on-a-chip integrated circuit as set forth in claim 13 wherein said field programmable gate array retrieves said first test program instructions from a second memory via said configurable data bus.

15. The system-on-a-chip integrated circuit as set forth in claim 14 wherein said second memory is one of said plurality of embedded circuit components.

16. The system-on-a-chip integrated circuit as set forth in claim 14 wherein said second memory is external to said integrated processing system.

17. The system-on-a-chip integrated circuit as set forth in claim 11 wherein said field programmable gate array is capable of determining if said plurality embedded circuit components passed tests performed by said first test program instructions and wherein said field programmable gate array, in response to a determination that said plurality of embedded circuit components passed said tests, is capable of receiving application program instructions from a second external source and executing said application program instructions.

18. The system-on-a-chip integrated circuit as set forth in claim 17 wherein said field programmable gate array stores said first test program instructions in an internal memory and overwrites said first test program instructions with said application program instructions.

19. The system-on-a-chip integrated circuit as set forth in claim 17 wherein said field programmable gate array is capable of receiving self test program instructions from a third external source and executing said self test program instructions in order to test the operation of said field programmable gate array.

20. The system-on-a-chip integrated circuit as set forth in claim 17 wherein said field programmable gate array is coupled to a built-in self test (BIST) circuit capable of testing the operation of said field programmable gate array.

21. For use in a field programmable gate array embedded in an integrated processing system, a method of testing other embedded circuit components in the integrated processing system comprising the steps of:

detecting a trigger signal in the integrated processing system;

in response to the trigger signal, receiving first test program instructions from a first external source; and executing the first test program instructions in order to test the other embedded circuit components in the integrated processing system.

22. The method as set forth in claim 21 further comprising the steps of:

determining if the other embedded circuit components passed tests performed by the first test program instructions; and in response to a determination that the other embedded circuit components passed the tests, receiving application program instructions from a second external source and executing the application program instructions.

23. The method as set forth in claim 22 further comprising the steps of:

receiving self test program instructions from a third external source; and executing the self test program instructions in order to test the operation of the field programmable gate array.

* * * * *